US010541032B2

(12) United States Patent
Tang et al.

(10) Patent No.: US 10,541,032 B2
(45) Date of Patent: Jan. 21, 2020

(54) RESPONDING TO POWER LOSS

(71) Applicant: MICRON TECHNOLOGY, INC., Boise, ID (US)

(72) Inventors: Qiang Tang, Cupertino, CA (US); Theodore T. Pekny, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 134 days.

(21) Appl. No.: 15/591,700

(22) Filed: May 10, 2017

(65) Prior Publication Data
US 2018/0330793 A1 Nov. 15, 2018

(51) Int. Cl.
*G11C 16/12* (2006.01)
*G11C 11/56* (2006.01)
*G11C 16/14* (2006.01)
*G11C 16/34* (2006.01)
*G11C 11/10* (2006.01)
*G11C 29/52* (2006.01)

(52) U.S. Cl.
CPC .......... *G11C 16/12* (2013.01); *G11C 11/5628* (2013.01); *G11C 16/3459* (2013.01)

(58) Field of Classification Search
CPC . G11C 16/12; G11C 11/5628; G11C 11/5635; G11C 29/52; G11C 16/3459; G11C 11/1068
See application file for complete search history.

(56) References Cited

U.S. PATENT DOCUMENTS

| 6,373,747 | B1* | 4/2002 | Harari | G06F 3/0601 |
| | | | | 365/185.03 |
| 7,193,896 | B2* | 3/2007 | Shiga | G11C 11/5628 |
| | | | | 365/185.03 |
| 9,570,159 | B1* | 2/2017 | Wakchaure | G11C 11/5628 |
| 9,582,370 | B2* | 2/2017 | Yano | G06F 11/1471 |
| 9,595,318 | B2* | 3/2017 | Hyun | G11C 11/5621 |
| 9,875,793 | B2* | 1/2018 | Kim | G06F 12/0246 |

(Continued)

OTHER PUBLICATIONS

Miller, et al.; "Identifying Asynchronous Power Loss"; U.S. Appl. No. 15/390,833, filed Dec. 27, 2017; Total pp. 44.

*Primary Examiner* — Phung M Chung
(74) *Attorney, Agent, or Firm* — Dicke, Billig & Czaja, PLLC

(57) ABSTRACT

Methods of operating apparatus include receiving user data for programming to a grouping of memory cells of the apparatus, associating an address of the grouping of memory cells with the user data, determining whether power loss to the apparatus is indicated while programming the user data to the grouping of memory cells, and if power loss to the apparatus is indicated while programming the user data to the grouping of memory cells, programming the address of the grouping of memory cells to a different grouping of memory cells of the apparatus. Methods of operating apparatus further include checking whether power loss to the apparatus during programming of user data to a grouping of memory cells of the apparatus is indicated, and, when power loss is indicated, checking feature settings of the apparatus to determine a location of the apparatus containing an address of the grouping of memory cells, and recovering the address of the grouping of memory cells from the determined location.

16 Claims, 14 Drawing Sheets

(56) References Cited

U.S. PATENT DOCUMENTS

| | | | |
|---|---|---|---|
| 2006/0062049 A1* | 3/2006 | Lee | G11C 16/225 |
| | | | 365/185.22 |
| 2006/0227624 A1* | 10/2006 | Shiga | G11C 11/5628 |
| | | | 365/210.12 |
| 2015/0113342 A1* | 4/2015 | Jung | G11C 8/14 |
| | | | 714/721 |

* cited by examiner

RESPONDING TO POWER LOSS

TECHNICAL FIELD

The present disclosure relates generally to memory and, in particular, in one or more embodiments, the present disclosure relates to methods to respond to power loss in an apparatus.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data and the UP data may be programmed to the memory cells in a first pass, resulting in four threshold voltage ranges, followed by the XP data (and, possibly, reprogramming of the UP data) in a second pass, resulting in eight threshold voltage ranges.

In each pass, programming typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

Due to the nature of flash memory devices, the physical location within a flash memory device for a given logical address will generally change over time. To address this changing correspondence, a Flash Translation Layer (FTL) is typically used to map the logical address to the physical address to which data has been stored. Although this high-level mapping information is often held in volatile memory for ease of use during operation of the memory device, such mapping information may also be periodically stored to non-volatile memory so that it may be retrieved during start-up of the device. Alternatively, this mapping information may be updated to non-volatile storage with each programming operation. If a memory device is powered down abruptly or otherwise loses power in an uncontrolled manner, e.g., asynchronous power loss, the most recent mapping information, as well as user data, may be invalid.

In the event of an unexpected power loss, the last written information may not be available to the host. Power loss detection algorithms may be used at a next power-up of the memory to scan its blocks of memory cells to determine where the last written information may have occurred in order to facilitate data recovery. As the number blocks of memory cells in a memory device increases, and as the number of possible data states increases, these power loss detection algorithms can become increasingly complex and time consuming, thereby slowing power-up of the memory.

DETAILED DESCRIPTION

Figure 1A:
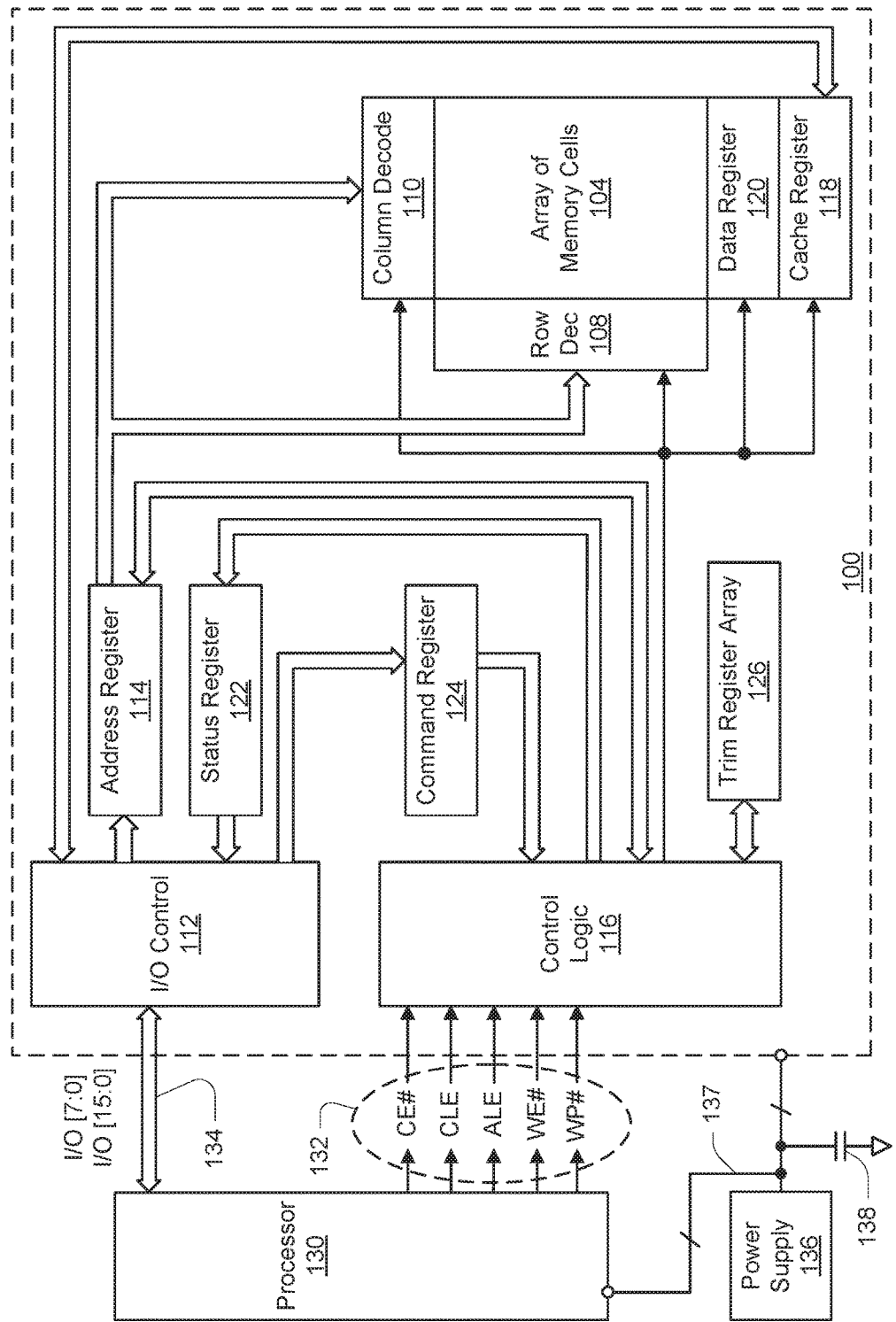
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Various embodiments seek to save an address of a memory (e.g., an indication of a location of a portion of the memory) being programmed at a time when power loss is indicated. In response to the indication of power loss during a programming operation for a particular address of the memory, the address may be saved to a particular (e.g., predetermined) location of the memory (e.g., a different address). The data (e.g., user data and associated overhead data) being programmed during the programming operation may further be saved to the same location as the address, or it may be saved to a different (e.g., predetermined) location of the memory. This can facilitate improvements in the time required to recover from a power loss event.

FIG. 1A is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may represent a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1A) of at least a portion of array of memory cells 104 are arranged in strings of series-connected memory cells.

A row decode circuitry 108 and a column decode circuitry 110 are provided to decode address signals. Address signals are received and decoded to access the array of memory cells 104, e.g., for programming operations, read operations, erase operations, etc. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register array 126 may be in communication with the control logic 116 to store trim data. Although depicted as a separate storage register, trim register array 126 may represent a portion of the array of memory cells 104.

A controller, such as an internal controller (e.g., control logic 116), controls access to the array of memory cells 104 in response to the commands and generates status information for the external processor 130, i.e., control logic 116 may be configured to perform access operations (e.g., programming operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, a write enable WE#, and a write protect WP#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Memory device 100 and/or processor 130 may receive power from the power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two.

Power is typically received from the power supply 136 using two or more voltage supply nodes 137, such as a supply voltage node (e.g., Vcc) and a reference voltage node (e.g., Vss or ground). It is not uncommon for a power supply 136 to provide more than two voltage supply nodes 137. For example, a common standard for switched-mode power supplies, ATX (Advanced Technology eXtended) 2.x, provides, using a 28-pin connection, four voltage supply nodes (or pins) at +3.3V, five voltage supply nodes at +5V, four voltage supply nodes at +12V, one voltage supply node at 12V, and ten voltage supply nodes at a reference voltage (e.g., 0V). The ATX 2.x standard further provides a power-on node for activating the foregoing voltage supply nodes when it is pulled to ground by an external circuit, a standby voltage supply node driven to +5V regardless of whether the other voltage supply nodes are being driven to their respective voltage levels (which can be used to power the external circuit responsible for pulling the power-on node to ground), and a power-good node for indicating when the other voltage supply nodes are stabilized at their respective voltages. The remaining pin of the ATX 2.x 28-pin standard is undefined. Memory device 100 and processor 130 may utilize differing combinations of voltage supply nodes 137 from power supply 136 depending upon their respective power needs. For simplicity, distribution of power from the voltage supply nodes 137 to components within the memory device 100 is not depicted.

The voltage supply nodes 137, or other components of the electronic system, may have an inherent or added energy storage device, such as capacitance 138, e.g., a hold-up capacitance, that can provide power to the memory device 100, and optionally to the processor 130, for some finite amount of time in the case of failure or removal of the power supply 136. Sizing of the capacitance 138 can be readily determined based on the power requirements of at least the memory device 100 for the operations described herein. While the energy storage device is depicted as the capacitance 138 in examples herein, the capacitance 138 could alternatively represent a battery. Furthermore, while the capacitance 138 is depicted to be external to the memory device 100, it could alternatively be an internal component of the memory device 100.

It will be appreciated by those skilled in the art that additional circuitry and signals can be provided, and that the memory device 100 of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
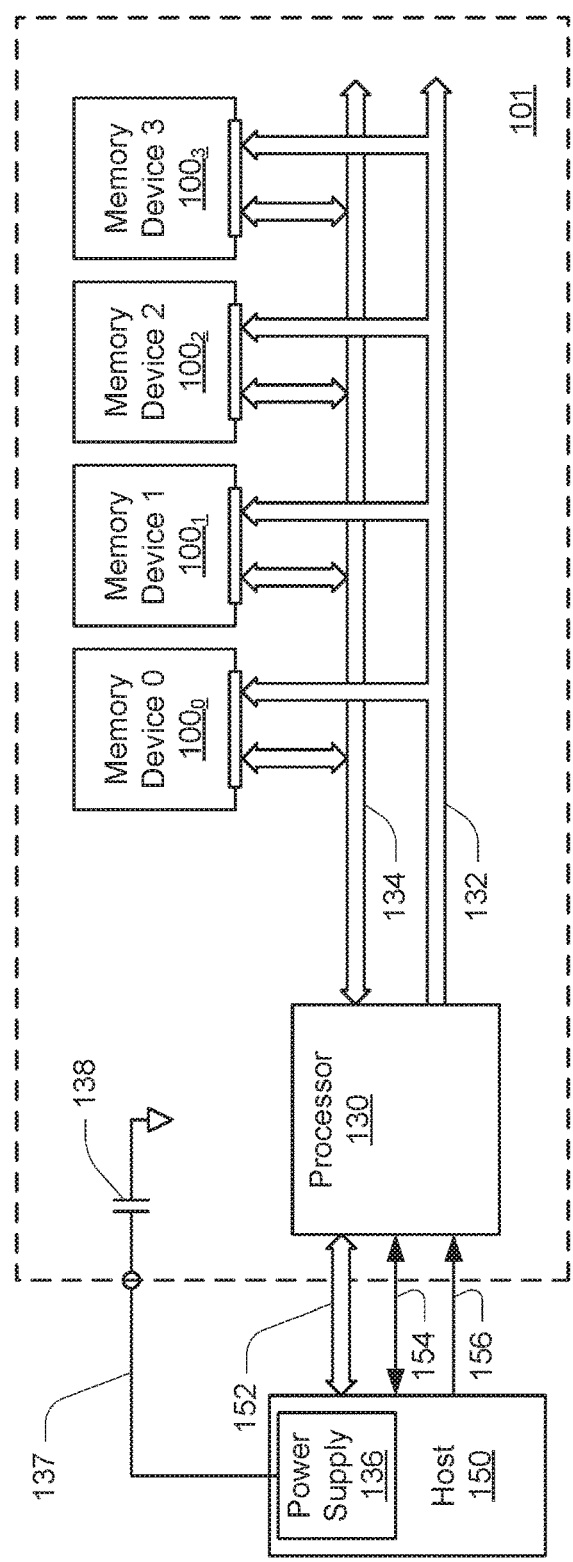
FIG. 1B is a simplified block diagram of an apparatus in the form of a memory module in communication with a host as part of an electronic system, according to another embodiment

A given processor 130 may be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, I/O bus 134, power supply 136, voltage supply nodes 137 and capacitance 138 may be as described with reference to FIG. 1A. For simplicity, distribution of power from the voltage supply nodes 137 to the memory devices 100 and processor 130 within the memory module 101 is not depicted. Although memory module (e.g., package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 may involve different communication links than those used between the processor 130 and the memory devices 100. For example, the memory module 101 may be an Embedded MultiMediaCard (eMMC) of a solid state drive (SSD). In accordance with existing standards, communication with an eMMC may include a data link 152 for transfer of data (e.g., an 8-bit link), a command link 154 for transfer of commands and device initialization, and a clock link 156 providing a clock signal for synchronizing the transfers on the data link 152 and command link 154. The processor 130 may handle many activities autonomously, such as power-loss detection, error correction, management of defective blocks, wear leveling and address translation.

Figure 2A:
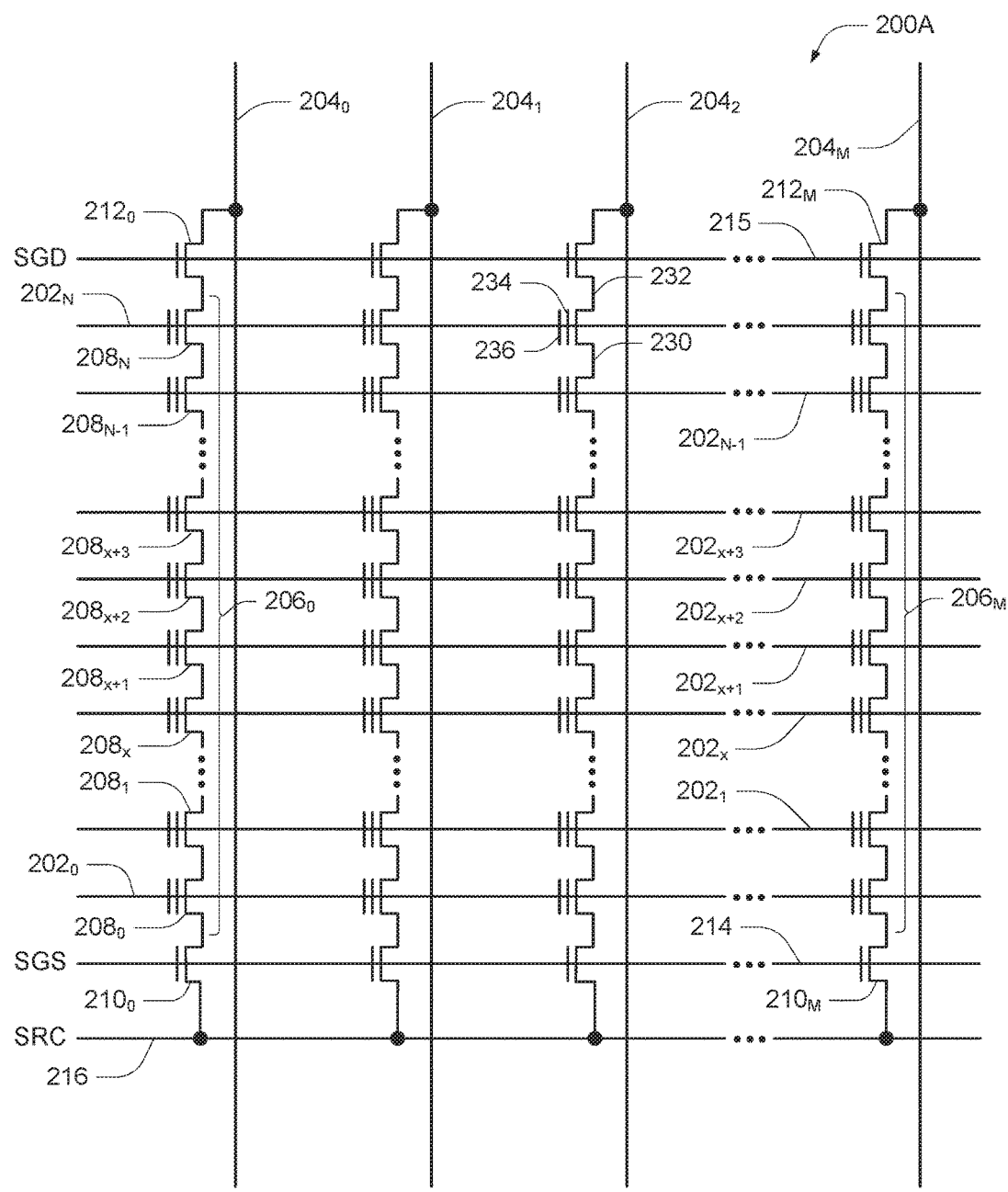
FIGS. 2A-2C are schematics of portions of an array of memory cells as could be used in a memory of the type described with reference to FIG. 1A.

FIG. 2A is a schematic of a portion of an array of memory cells 200A as could be used in a memory of the type described with reference to FIG. 1A, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
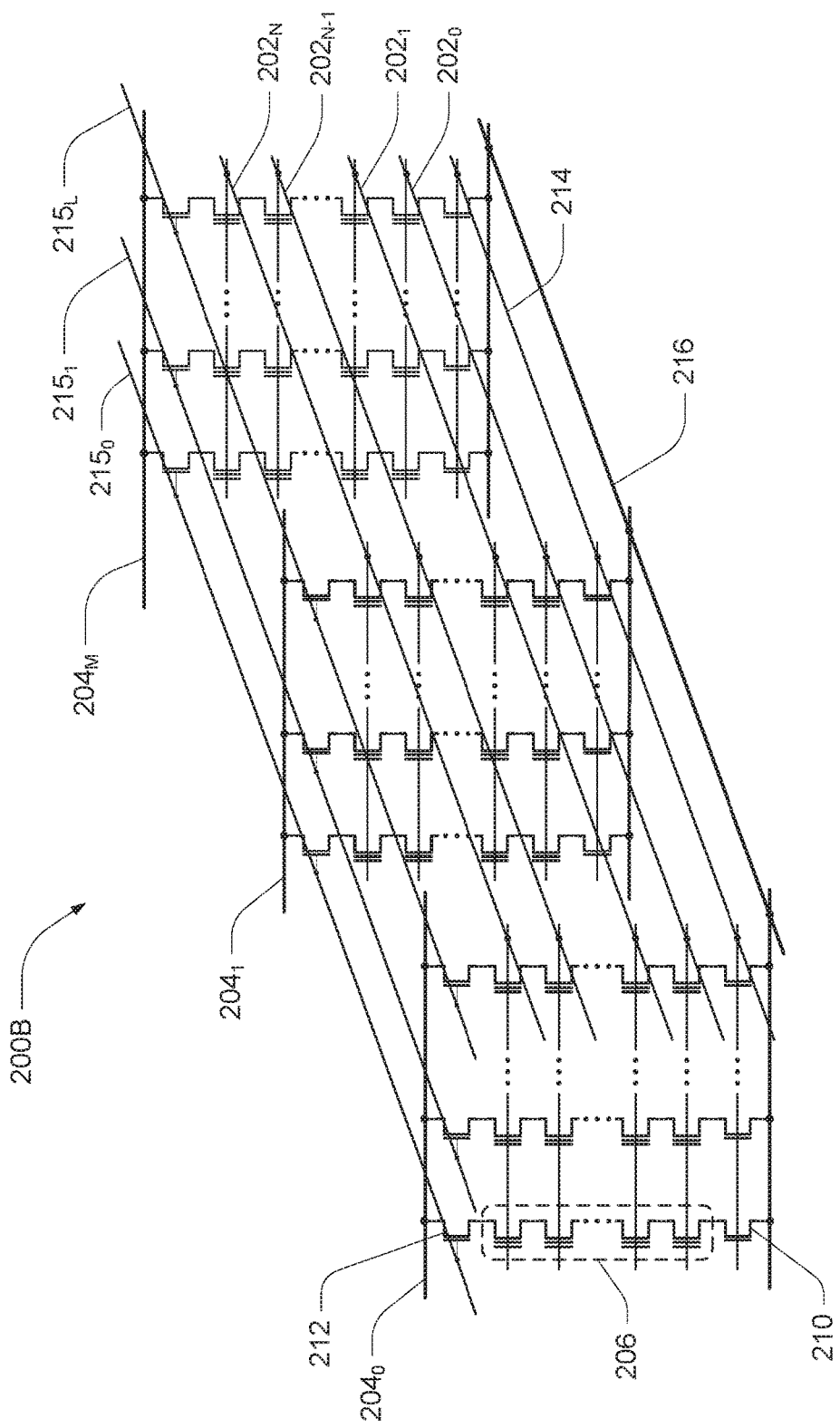

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
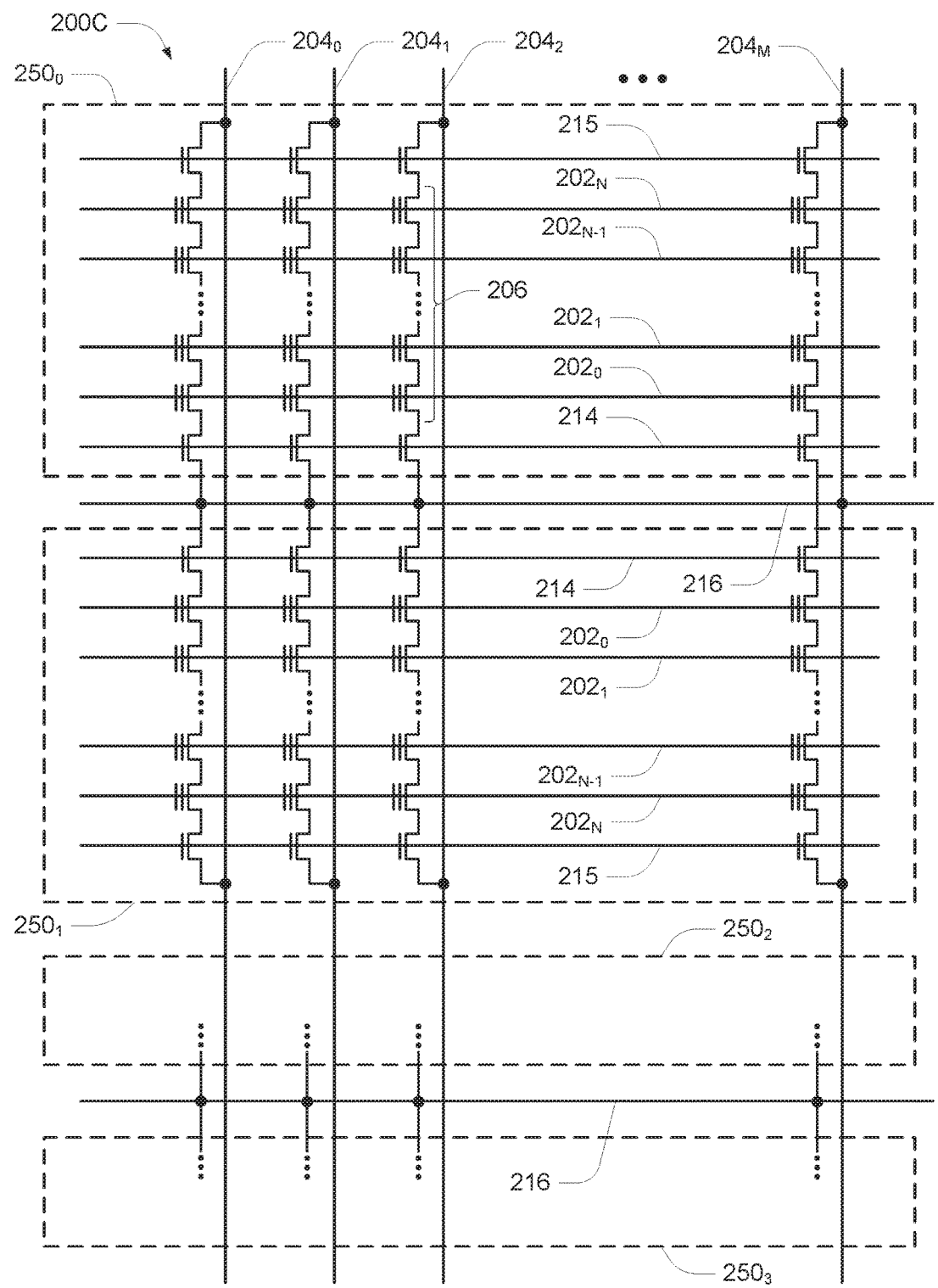

FIG. 2C is a further schematic of a portion of an array of memory cells 200C as could be used in a memory of the type described with reference to FIG. 1A, e.g., as a portion of array of memory cells 104. Like numbered elements in FIG. 2C correspond to the description as provided with respect to FIG. 2A. Array of memory cells 200C may include NAND strings 206, word lines 202, bit lines 204, source select lines 214, drain select lines 215 and common source 216 as depicted in FIG. 2A. The array of memory cells 200A may be a portion of the array of memory cells 200C, for example. FIG. 2C depicts groupings of NAND strings 206 into blocks of memory cells 250. Blocks of memory cells 250 may be a set of memory cells 208 that may be erased together in a single erase operation, sometimes referred to as erase blocks.

Figure 3A:
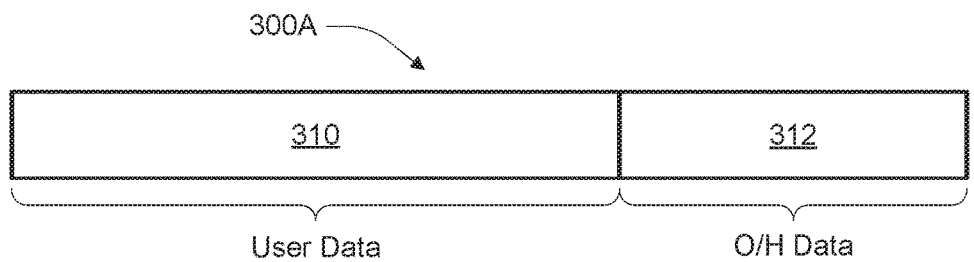
FIGS. 3A and 3B are representations of pages of memory cells for use with embodiments.
Figure 3B:
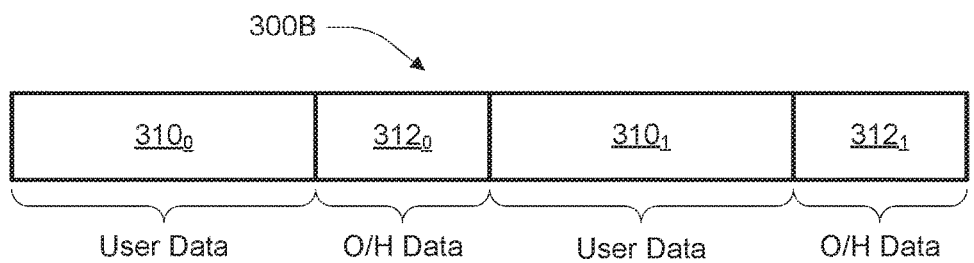

FIGS. 3A and 3B are representations of a page of memory cells 300, i.e., 300A and 300B, respectively, for use with embodiments. In FIG. 3A, the page of memory cells 300A may represent a grouping of memory cells that may be programmed concurrently during a single programming operation. For example, the page of memory cells 300A might include all or a subset (e.g., even or odd) of memory cells (e.g., memory cells 208 of FIG. 2A) connected to an access line (e.g., access line $202_1$ of FIG. 2A). The page of memory cells 300A might alternatively include memory cells from more than one memory device (e.g., memory devices $100_0$-$100_3$ of FIG. 1B). For example, the page of memory cells 300A might include all or a subset (e.g., even or odd) of memory cells (e.g., memory cells 208 of FIG. 2A) connected to an access line (e.g., access line $202_1$ of FIG. 2A) of one memory device (e.g., memory device $100_0$ of FIG. 1B) and all or a subset (e.g., even or odd) of memory cells (e.g., memory cells 208 of FIG. 2A) connected to an access line (e.g., access line $202_1$ of FIG. 2A) of another memory device (e.g., memory device $100_2$ of FIG. 1B).

The page of memory cells 300A includes a portion of memory cells 310 configured for storage of user data, e.g., memory cells addressable for storage of user data. User data might include data received in association with a write command received by the memory to initiate a programming operation. The page of memory cells 300A further includes a portion of memory cells 312 configured for storage of overhead data (sometimes referred to as metadata), e.g., memory cells addressable for storage of overhead data. Overhead data associated with the user data might include data generated by the memory in response to a write command received by the memory. For example, overhead data might include status indicators, error correction code data, mapping information and the like. Overhead data associated with the user data might alternately or further include data received with the user data. The relative sizing of the portion of memory cells 310 configured for storage of user data and the portion of memory cells 312 configured for storage of overhead data may not be representative of the relative number of memory cells in each portion. As one example, a page of memory cells 300A might include 4096 Bytes of user data and 96 Bytes of overhead data. Other sizes of page of memory cells, and the relative number of memory cells in each portion for any given page size, are also known. Data structures represented by the pages of memory cells 300 depicted in FIGS. 3A and 3B are typically defined by a controller (e.g., internal controller) of the memory performing access operations (e.g., programming operations) on an array of memory cells.

While the portion of memory cells 310 and the portion of memory cells 312 are each depicted to be single contiguous portions of memory cells, memory cells of the portion of memory cells 310 might be interposed between memory cells of the portion of memory cells 312, and vice versa, such that the portion of memory cells 310 and/or the portion of memory cells 312 may be non-contiguous portions of memory cells. FIG. 3B is a representation of a page of memory cells 300B for use with embodiments depicting such distribution of user data and overhead data. The page of memory cells 300B may represent a grouping of memory cells that may be programmed concurrently during a single programming operation as described with reference to the page of memory cells 300A.

The page of memory cells 300B includes two portions of memory cells 310 (e.g., $310_0$ and $310_1$) configured for storage of user data, and two portions of memory cells 312 (e.g., $312_0$ and $312_1$) configured for storage of overhead data. Other arrangements are also permissible.

With reference back to FIG. 1B, host 150 might transmit a write command and associated data to the memory module 101, indicating a desire to store the associated data to the memory module 101. The processor 130 might then transmit a write command to the memory devices 100, indicating a desire to store the associated data to one or more of the memory devices 100 in a portion of a grouping of memory cells (e.g., a page of memory cells 300) designated for storage of user data. The processor 130 might further generate error correction code data associated with the user data and/or other overhead data to be stored to a portion of the grouping of memory cells (e.g., of the page of memory cells 300) designated for storage of overhead data concurrently with the storage of the user data to the portion of the grouping of memory cells designated for storage of user data.

Figure 4:
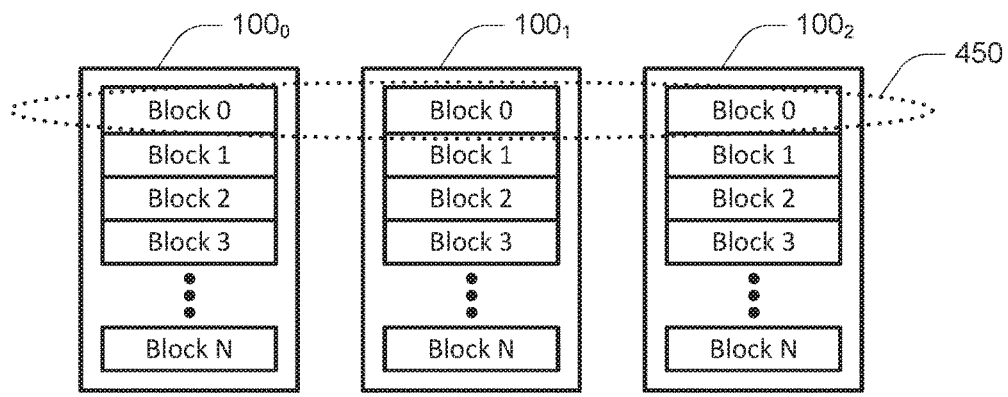
FIG. 4 is a representation of blocks of memory cells for use with embodiments.

FIG. 4 is a representation of blocks of memory cells for use with embodiments. As depicted in FIG. 4, each memory device 100 might include multiple blocks of memory cells, e.g., each containing Blocks 0-N. Blocks of memory cells of multiple memory devices, e.g., Blocks 0 for each memory device $100_0$, $100_1$ and $100_2$, might be logically combined to define a super block of memory cells 450. A super block of memory cells 450 might be formed for each corresponding block of memory cells (e.g., blocks of memory cells sharing the same logical address within their respective memory device 100) of the memory devices 100, e.g., a block of memory cells from each of a plurality of arrays of memory cells. For example, Blocks 1 for each memory device 100 might be logically combined to define a super block of memory cells, Blocks 2 for each memory device 100 might be logically combined to define a super block of memory cells, Blocks 3 for each memory device 100 might be logically combined to define a super block of memory cells, etc. Although the super block of memory cells 450 is depicted to include a block of memory cells from each of three memory devices 100 in FIG. 4, a super block could include blocks of memory cells from some other number of memory devices 100.

The page of memory cells 300 (e.g., 300A or 300B) might represent a logical page of memory cells of a single block of memory cells 250 (e.g., of FIG. 2C), or it might represent a logical page of memory cells of more than one block of memory cells, e.g., a super block of memory cells 450.

Furthermore, a page of memory cells 300 representing a logical page of memory cells of the super block of memory cells 450 might contain user data and overhead data in each block of memory cells (e.g., Block 0 of memory device $100_0$, Block 0 of memory device $100_1$, and Block 0 of memory device $100_2$), or it might contain user data and/or overhead data in only a subset of the blocks of memory cells of the super block of memory cells 450. For example, user data of a page of memory cells 300 of the super block of memory cells 450 might be stored in Block 0 of memory device $100_0$, Block 0 of memory device $100_1$, and Block 0 of memory device $100_2$, but overhead data of that page of memory cells 300 might only be stored to Block 0 of memory device $100_2$.

Various embodiments seek to program an address of a grouping of memory cells, being programmed at a time when power loss is indicated, to a different grouping of memory cells. In response to the indication of power loss during a programming operation for a particular address of the memory, the address (e.g., physical address) may be saved to a particular (e.g., predetermined) location of the memory (e.g., a different physical address). The data (e.g., user data and overhead data) being programmed during the programming operation may further be saved to the same location as the address, or that data may be saved to a different (e.g., predetermined) location of the memory. FIGS. 5A-5D depict various examples of where the address may be saved within a page of memory cells. FIGS. 5A-5D each depict an example using a data structure of a page of memory cells (e.g., a data structure of page of memory cells 300A or 300B) such as described with reference to FIGS. 3A and 3B.

Figure 5A:
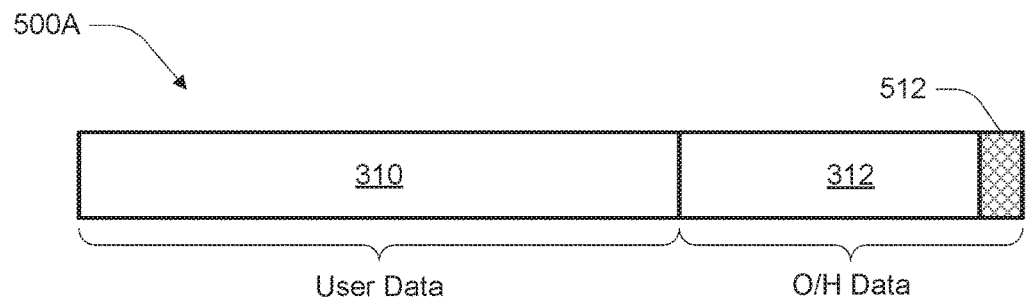
FIGS. 5A-5D are representations of pages of memory cells for use with embodiments depicting various locations an address might be saved within a page of memory cells.

With reference to FIG. 5A, the page of memory cells 500A includes a portion of memory cells 310 configured for storage of user data, and a portion of memory cells 312 configured for storage of overhead data. For certain embodiments, a portion 512 of the portion of memory cells 312 may be unused, e.g., the data structure of the controller performing the programming operation may not define those memory cells for use for user data or overhead data, and may not write data to those memory cells of the portion of memory cells 312 during a normal programming operation. For such embodiments, the address of the programming operation being performed when power loss is indicated may be stored to this portion 512 without affecting the user data or overhead data associated with the programming operations. However, it is recognized that error correction, e.g., using error correction code that may be part of the overhead data, may allow storing the address to the portion 512 even if that portion 512 is normally designated for storage of overhead data during a normal programming operation, e.g., where the error correction code is sufficiently robust to permit identification and correction of the missing data as well as any other data errors of the page of memory cells. Replacing overhead data with the address might involve (e.g., consist of) replacing overhead data other than error correction code.

Figure 5B:
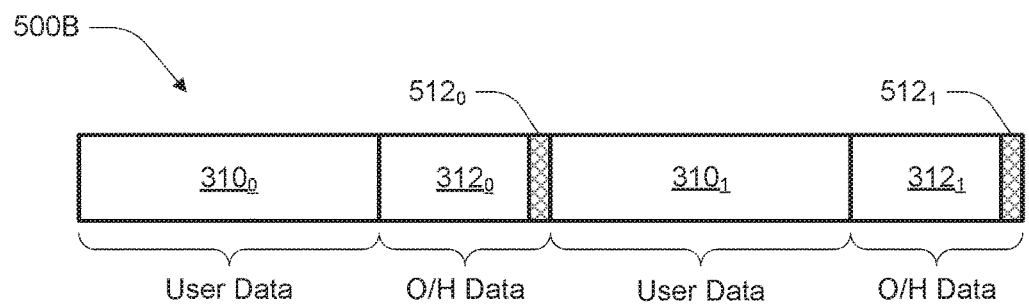

With reference to FIG. 5B, the page of memory cells 500B includes two portions of memory cells 310 (e.g., $310_0$ and $310_1$) configured for storage of user data, and two portions of memory cells 312 (e.g., $312_0$ and $312_1$) configured for storage of overhead data. In such an example, a portion of the address might be stored to a portion $512_0$ of the portion of memory cells $312_0$, and a portion (e.g., a remaining portion) of the address might be stored to a portion $512_1$ of the portion of memory cells $312_1$. Similar to the example of FIG. 5A, the portions $512_0$ and $512_1$ may represent unused portions of the portion of memory cells $312_0$ and the portion of memory cells $312_1$, respectively, or they may represent portions designated for storage of overhead data during a normal programming operation.

Figure 5C:
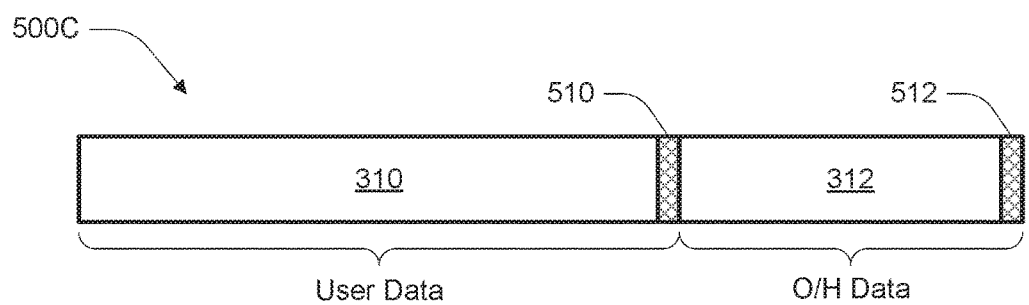

With reference to FIG. 5C, the page of memory cells 500C includes a portion of memory cells 310 configured for storage of user data, and a portion of memory cells 312 configured for storage of overhead data. Consider the example where a portion 512 of the portion of memory cells 312 may be unused, e.g., the data structure of the controller performing the programming operation may not define those memory cells for use for user data or overhead data, and may not write data to those memory cells of the portion of memory cells 312 during a normal programming operation, but that the portion 512 is not large enough to store the entire address associated with the programming operation. For such embodiments, a portion of the address of the programming operation being performed when power loss is indicated may be stored to this portion 512, while another portion (e.g., a remaining portion) may be stored to the portion 510 of the portion of memory cells 310 configured for storage of user data. While the portion 510 may represent a portion of the portion of memory cells 310 that are designated for storage of user data during a normal programming operation, error correction may facilitate restoration of the missing (e.g., replaced) user data.

Figure 5D:
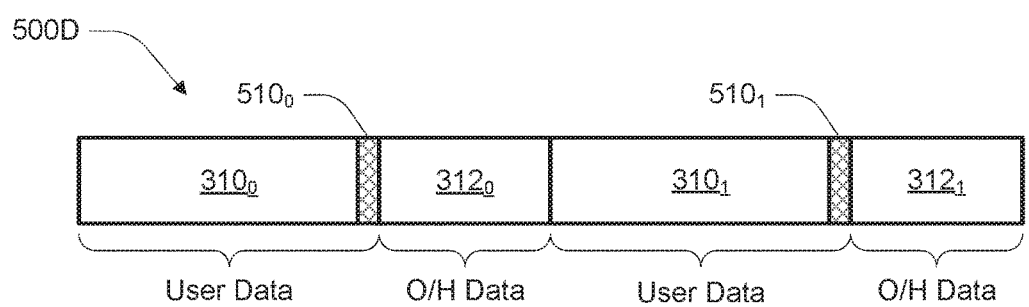

With reference to FIG. 5D, the page of memory cells 500D includes two portions of memory cells 310 (e.g., $310_0$ and $310_1$) configured for storage of user data, and two portions of memory cells 312 (e.g., $312_0$ and $312_1$) configured for storage of overhead data. In such an example, a portion of the address might be stored to a portion $510_0$ of the portion of memory cells $310_0$, and a portion (e.g., a remaining portion) of the address might be stored to a portion $510_1$ of the portion of memory cells $312_1$. Similar to the example of FIG. 5A, the portions $510_0$ and $510_1$ may represent unused portions of the portion of memory cells $310_0$ and the portion of memory cells $310_1$, respectively, or they may represent portions designated for storage of overhead data during a normal programming operation.

As can be seen with reference to FIGS. 5A-5D, the address of the programming operation being performed when power loss is indicated may be stored to any portion of a grouping of memory cells, e.g., a page of memory cells 500A-500D. In addition, while the foregoing examples depict the address stored to portions 510 and/or 512 located at an end of their portion of memory cells 310 and/or 312, respectively, the placement of the portions 510 and/or 512 may be made anywhere within their respective portion of memory cells 310 and/or 312, and may include more than one portion 510 and/or 512 for one or more portions of memory cells 310 and/or 312, respectively. Furthermore, while examples having more than one portion of memory cells 310 and/or 312 may have depicted the use of each instance of a portion of memory cells 310 or 312 for storage of a portion of the address, the address could be stored in less than all instances of a portion of memory cells 310 and/or 312. For example, with reference to FIG. 5B, the portion $512_0$ of the portion of memory cells $312_0$ may be used to store the entire address.

Figure 6:
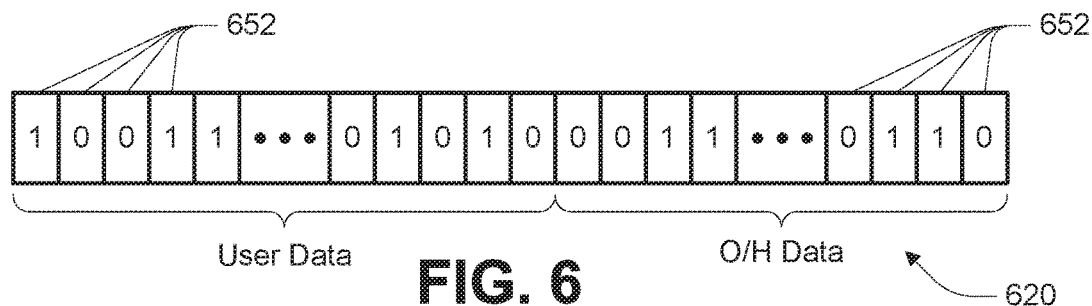
FIG. 6 is a representation of a register for use with embodiments.

FIG. 6 is a representation of a register 620 for use with embodiments. The register 620 might represent the data register 120 of FIG. 1A, for example. It is noted that the cache register 118 of FIG. 1A may utilize a similar (e.g., the same) structure. The register 620 might have a plurality of data latches 652, and might have a data structure similar to the data structure of a page of memory cells of its corresponding memory. For example, a portion of the data latches 652 may correspond to memory cells configured to store user data and a portion of the data latches 652 may correspond to memory cells configured to store overhead data. In the example of FIG. 6, the register 620 has a data structure similar to the data structure of the page of memory cells 500A of FIG. 5A and/or 500C of FIG. 5C.

Each data latch 652 of the register 620 might store a single digit of data, such as a logical 0 or logical 1 for binary data, to be programmed to a grouping of memory cells (e.g., a page of memory cells) during a single programming operation. Each data latch 652 of the register 620 may latch the data to be programmed to a single memory cell of the grouping of memory cells in a one-to-one relationship. As is common for a programming operation, a logical 1 in a data latch 652 may indicate that its corresponding memory cell already has its desired data state or is otherwise to be inhibited from changing (e.g., increasing) its threshold voltage in response to a programming pulse of the programming operation, and a logical 0 in a data latch 652 may indicate a desire to change (e.g., increase) a threshold voltage of its corresponding memory cell in response to the programming pulse of the programming operation. Following a verify (e.g., program verify) operation, a memory cell whose data latch 652 contained a logical 0 might be changed to a logical 1 in order to inhibit that memory cell from further programming if that memory cell is determined to have reached its desired data state. It will be apparent that these logical values could be reversed, with a logical 0 indicating a desire to inhibit programming and a logical 1 indicating a desire to enable programming.

With reference back to the example page of memory cells 500A of FIG. 5A, to program an address to the portion 512 of the portion of memory cells 312, the address (e.g., digits of the address) might be stored into a portion of (e.g., one or more of) the data latches 652 of the register 620 that correspond to the memory cells of the portion 512 of the portion of memory cells 312. As noted, the data latches 652 storing the address data to be programmed into the memory cells of the portion 512 of the portion of memory cells 312 might have previously contained overhead data for programming into the memory cells of the portion 512 of the portion of memory cells 312, such that they would be over-written, or they may have been unused, e.g., either containing all logical 1s in this example or otherwise containing do-not-care data.

Similarly, with reference back to the example page of memory cells 500C of FIG. 5C, to program a portion of an address to the portion 512 of the portion of memory cells 312, and another portion of the address to the portion 510 of the portion of memory cells 310, the respective portions of the address (e.g., digits of the address) might be stored into portions of the data latches 652 of the register 620 (e.g., each containing one or more of the data latches 652) that correspond to the memory cells of the portion 510 of the portion of memory cells 312 and of the portion 512 of the portion of memory cells 312. Again, the data latches 652 storing the address data to be programmed into the memory cells of the portion 510 of the portion of memory cells 310 and the portion 512 of the portion of memory cells 312 might have previously contained overhead data for programming into those memory cells, or they may have been unused.

It is noted that there may be multiple instances of registers 620 representing a data register 120 for an array of memory cells 104 such as depicted in FIG. 1A. For example, in TLC, one register 620 may store digits of the lower page data (e.g., data for a first page of memory cells), one register 620 may store digits of the upper page data (e.g., data for a second page of memory cells), and one register 620 may store digits of the extra page data (e.g., data for a third page of memory cells). It is noted that the lower page data, upper page data and the extra page data may be programmed into a same grouping of physical memory cells despite corresponding to different pages (e.g., logical pages) of memory cells.

Figure 7:
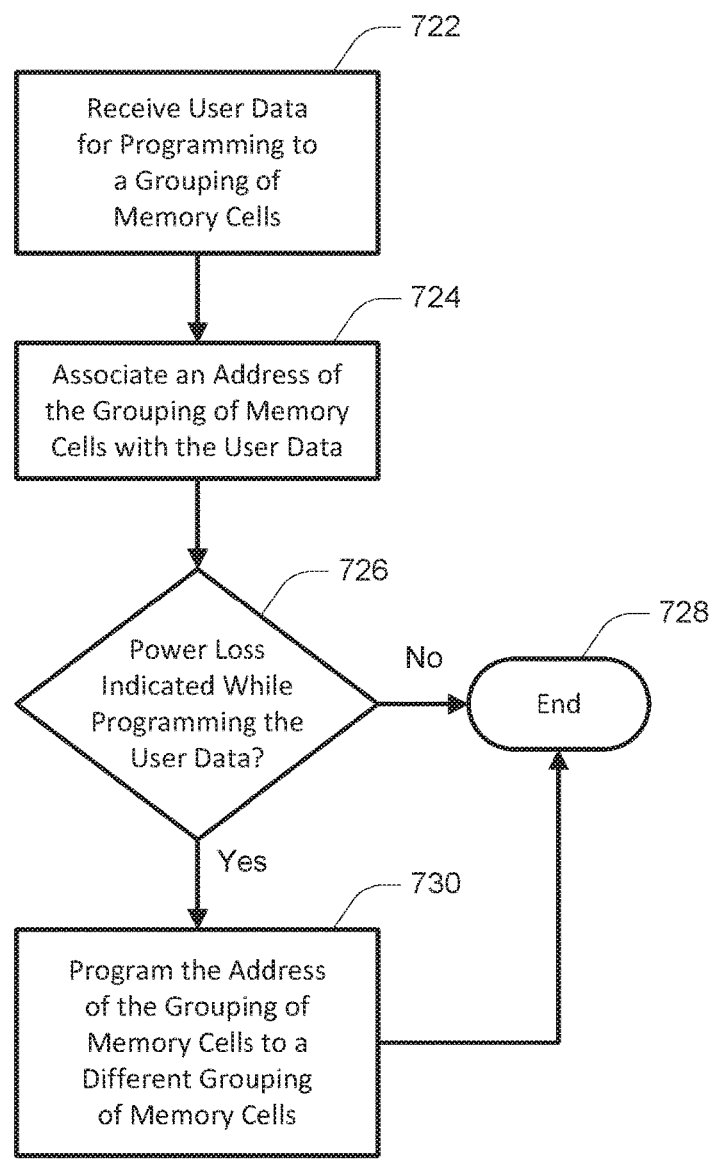
FIG. 7 is a flowchart of a method of operating an apparatus according to an embodiment.

FIG. 7 is a flowchart of a method of operating an apparatus (e.g., a memory) according to an embodiment. At 722, user data is received by the apparatus for programming to a grouping of memory cells, e.g., via a programming operation. For example, the user data may be associated with a write command received by the apparatus and identifying an address (e.g., logical or physical) of a grouping of memory cells (e.g., a page of memory cells) for storing the user data. As an example, the grouping of memory cells may correspond to a logical page of memory cells (e.g., including memory cells having control gates commonly connected to word line $202_{N-1}$ of block of memory cells $250_1$ of FIG. 2C). Overhead data associated with the user data may also be received by the apparatus along with the user data, and/or generated by the apparatus, also for programming to the grouping of memory cells. For example, the overhead data may be associated with the write command, it may be generated by the apparatus, or some combination of the two. While not discussed with reference to FIG. 7, such overhead data may be programmed concurrently with the received user data to the grouping of memory cells.

At 724, an address of the grouping of memory cells is associated with the user data. The address may uniquely identify the grouping of memory cells. For embodiments where the logical to physical translation information is not saved prior to completion of the programming operation, or otherwise, the address might be a physical address of the apparatus. Alternatively, the address might be a logical address of the apparatus. For some embodiments, the address might identify a particular page of memory cells within a particular block of memory cells of an array of memory cells. For other embodiments, the address might identify a particular page of memory cells within a particular block of memory cells for each of a plurality of blocks of memory cells, e.g., for some embodiments utilizing super blocks. For other embodiments utilizing super blocks, the user data for programming to a grouping of memory cells of a particular block of memory cells of the super block may be associated with only the address identifying that grouping of memory cells within that particular block of memory cells. Associating the address of the grouping of memory cells with the user data may include storing the address to a portion of a register (e.g., a register 620), along with the user data, for programming to the grouping of memory cells. Associating the address of the grouping of memory cells with the user data may further include storing the address to a portion of a register (e.g., a register 620), along with the user data, for programming to a different grouping of memory cells. The storing of the address to a portion of a register could occur prior to, or subsequent to, 726.

At 726, a decision is made whether power loss was indicated while programming the user data to the grouping of memory cells, e.g., before completion of the programming operation. Power loss might be indicated, as one example, by a control signal received by the apparatus. For example, a control signal normally expected to be logic high during the programming operation, such as a write protect (WP#) control signal, might toggle to logic low if a controller providing that control signal loses power. In this case, the transition of the control signal to logic low could be deemed an indication of power loss to the apparatus. Power loss may be deemed to have occurred if there is an indication that power loss has occurred, regardless of whether the apparatus loses power. The determination of 726 might represent an interrupt to the programming operation responsive to a particular indication of power loss, e.g., a particular logic level of a control signal, or it might represent a periodic (e.g., once every iteration of the programming operation) check for an indication of power loss during the programming operation.

If no power loss is indicated at 726, the process (e.g., programming operation) may end at 728. If power loss is indicated at 726, the process may proceed to 730. At 730, the address of the grouping of memory cells may be programmed to a different grouping of memory cells, e.g., to a different page of memory cells of a same block of memory cells (e.g., continuing with the example provided with respect to 722, including memory cells having control gates connected to word line $202_0$ of block of memory cells $250_1$ of FIG. 2C), or a page of memory cells of a different block of memory cells (e.g., continuing with the example provided with respect to 722, including memory cells having control gates connected to word line $202_0$ of block of memory cells $250_0$ of FIG. 2C). As noted previously, an energy storage device, such as capacitance 138 of FIGS. 1A-1B, might be used to supply a finite amount of power to the apparatus in order to program the address to the different grouping of memory cells. The different grouping of memory cells may be a predetermined location, e.g., a particular location that the apparatus might be configured to read upon a power-up to determine whether the apparatus had an orderly shutdown. As an example, this particular location containing any memory cells having other than the erased data state might indicate that power loss occurred during a programming operation. Upon programming the address of the grouping of memory cells to the different grouping of memory cells, the process (e.g., programming operation) may end at 728.

For some embodiments, the user data and/or overhead data may also be programmed to the different grouping of memory cells at 730. For some other or further embodiments, the user data and/or overhead data may be programmed to a second different grouping of memory cells. For example, the address associated with the grouping of memory cells might be programmed to one page of memory cells at some predetermined location of the apparatus, and the user data and/or overhead data might be programmed to another page of memory cells at some other predetermined location of the apparatus. Such programming of the user data and/or overhead data to the second different grouping of memory cells may be performed concurrently with (e.g., to two different blocks of memory cells), prior to, or subsequent to, programming of the address to the different grouping of memory cells.

Figure 8A:
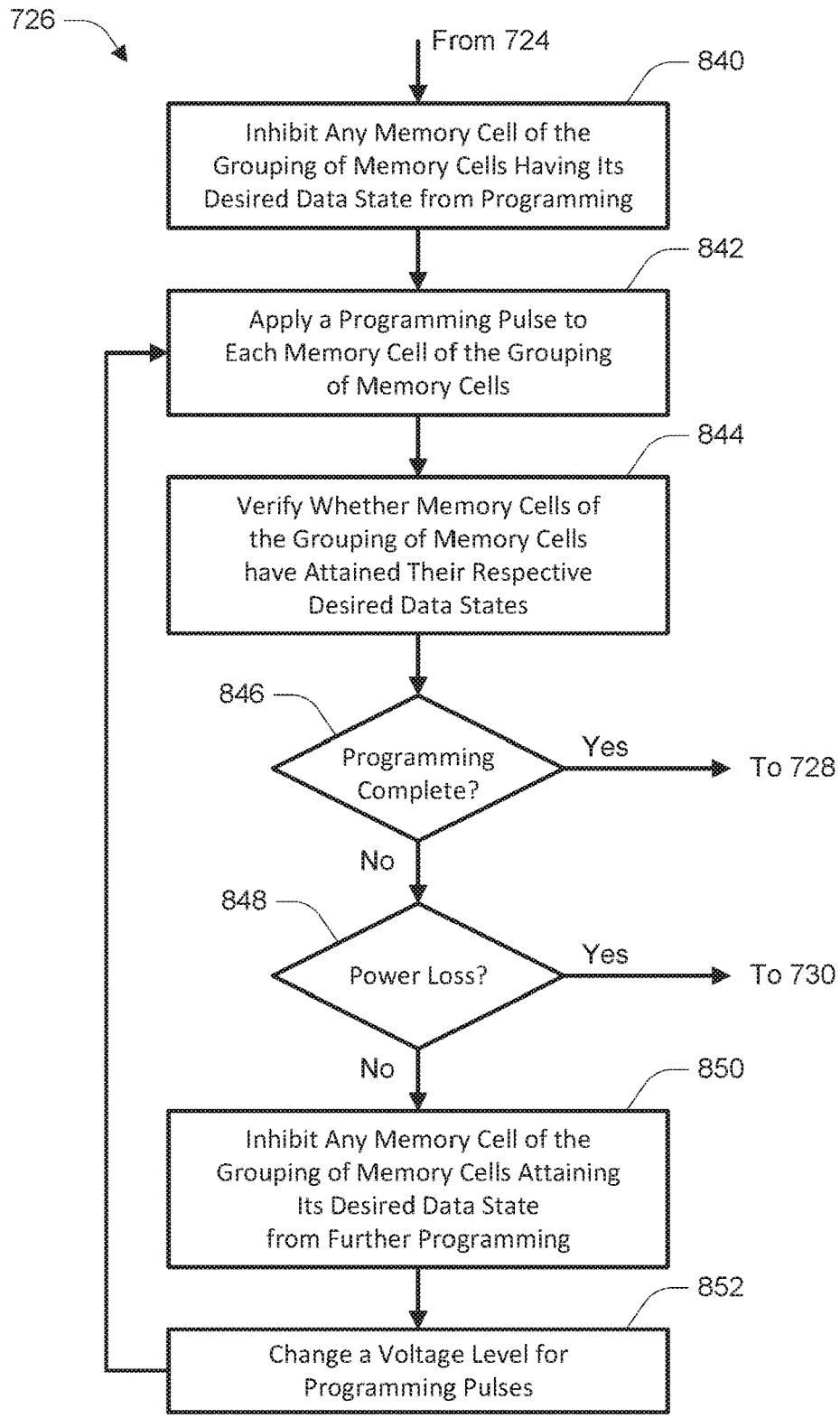
FIGS. 8A-8B are flowcharts of methods of operating an apparatus according to further embodiments.

Determining whether power loss is indicated at 726 may include determining whether power loss is indicated while the grouping of memory cells are being iteratively programmed. FIG. 8A is a flowchart of a method of operating an apparatus (e.g., a memory) according to another embodiment providing an example of iterative programming during the programming of 726 of FIG. 7. At 840, any memory cell of the grouping of memory cells having its desired data state for the programming operation, is inhibited from programming. At 842, a programming pulse is applied to each memory cell of the grouping of memory cells. At 844, a verify (e.g., program verify) operation is performed to determine whether memory cells of the grouping of memory cells have attained their respective desired data states for the programming operation in response to the programming pulse of 842. At 846, a determination is made as to whether programming is complete, e.g., the memory cells of the grouping of memory cells have attained their respective desired data states or a failure condition has been declared. If programming is complete at 846, the process can end at 728. If programming is not complete at 846, the process can continue to 848.

At 848, a determination is made whether power loss is indicated during the programming operation. If no power loss is indicated, the programming operation can continue to 850. As described, the determination of 848 might represent a periodic (e.g., once every iteration) check for an indication of power loss during the iterative process of 726, such as once after determining at 846 whether programming is complete. If power loss is indicated at 848, the process can proceed to 730. If power loss is not indicated at 848, any memory cell of the grouping of memory cells determined to have attained its desired data state at 844 may be inhibited from further programming at 850, e.g., by changing a value of its corresponding data latch. A voltage level for programming pulses is changed (e.g., increased) at 852 and the process returns to 842. As noted previously, an energy storage device, such as capacitance 138 of FIGS. 1A-1B, might be used to supply a finite amount of power to the apparatus in order to seek to continue the iterative process of 726 even if power loss has occurred.

Figure 8B:
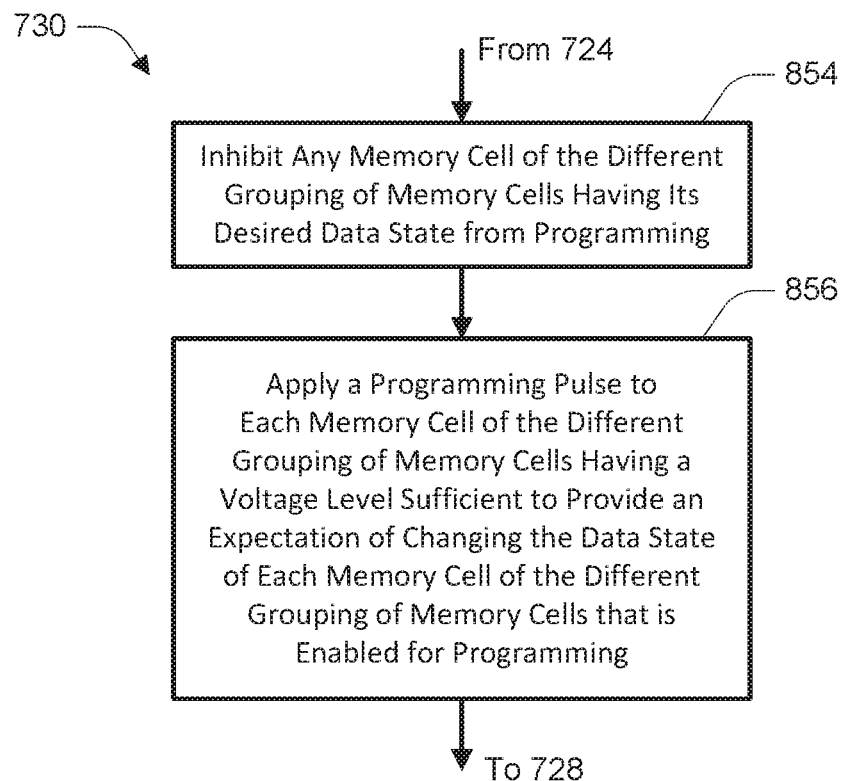

FIG. 8B is a flowchart of a method of operating an apparatus (e.g., a memory) according to another embodiment providing an example of the programming of the address of the grouping of memory cells to a different grouping of memory cells, e.g., the programming of 730 of FIG. 7. At 854, any memory cell of the different grouping of memory cells having its desired data state for the programming operation, is inhibited from programming. For example, the desired data states for the different grouping of memory cells may include the desired data states of the memory cells corresponding to the received user data and the desired data states of the memory cells corresponding to the address of the grouping of memory cells. The desired data states for the different grouping of memory cells may further include the desired data states of the memory cells corresponding to the overhead data. As noted with respect to FIGS. 5A-5D, the desired data states of the memory cells corresponding to the address of the grouping of memory cells may replace the desired data states of the memory cells corresponding to the received user data (and/or the overhead data) where memory cells corresponding to the address of the grouping of memory cells are memory cells used for programming of user data (and/or overhead data) during a normal programming operation.

At 856, a programming pulse is applied to each memory cell of the different grouping of memory cells having a voltage level sufficient to provide an expectation of changing the data state of each memory cell of the different group of memory cells that is enabled for (i.e., not inhibited from) programming. For example, a programming operation for a particular page of memory cells might be binary, even for memory cells designated for storage of more than one digit (e.g., bit) per memory cell. Considering the example of TLC programming where each memory cell may have one of eight defined data states, the programming operation (e.g., the programming operation of FIG. 7) may correspond to only one of the lower page data, the upper page data or the extra page data, and the data for any one of the lower page data, the upper page data or the extra page data may essentially define that there is a desire to either inhibit programming or to increase the threshold voltage of a corresponding memory cell during the programming operation for that particular page. As such, when programming the memory cells of the different grouping of memory cells, the particular page of data being programmed may be saved merely by either maintaining a memory cell in an erased state, or increasing its threshold voltage enough to be in some data state other than the erased state (e.g., any threshold voltage outside of the range of threshold voltages corresponding to the erased state) in order to represent the binary data.

As noted with respect to FIG. 7, the storing of the address associated with a grouping of memory cells to a portion of a register (e.g., register 620) might occur prior to initiating the programming operation to program the user data to the grouping of memory cells (e.g., prior to determining that power loss is indicated), or might occur subsequent to determining that power loss is indicated during the programming operation. FIGS. 9A-9D and 10A-10B are representations of registers in use with embodiments, such as use during programming operations of an apparatus (e.g., memory). FIGS. 9A-9D will be used to provide an example of storing the address to a register prior to determining that power loss is indicated, while FIGS. 9A-9C and 10A-10B will be used to provide an example of storing the address to a register subsequent to determining that power loss is indicated.

Figure 9A:
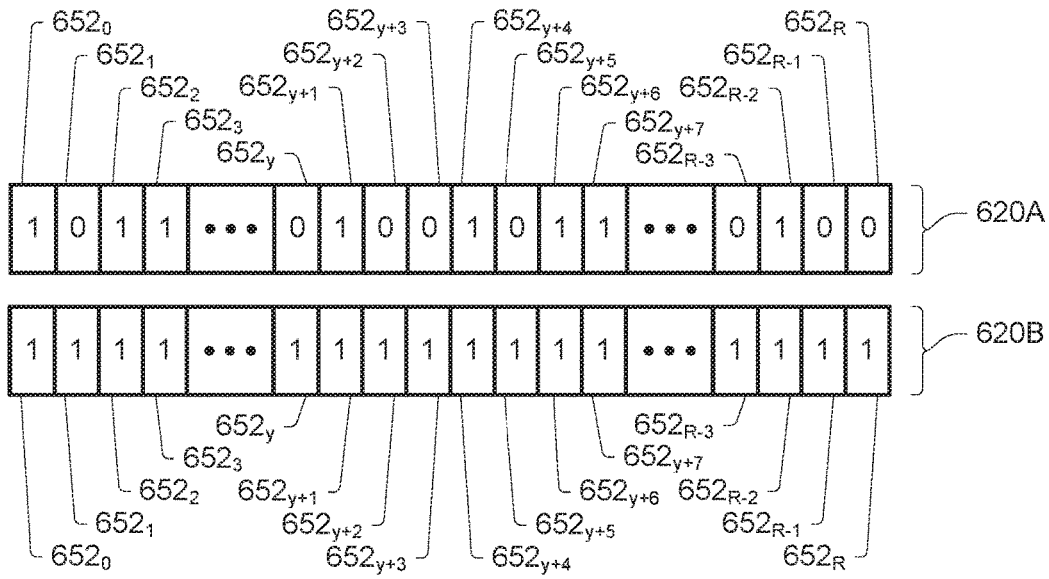
FIGS. 9A-9D are representations of registers in use with embodiments.

FIG. 9A depicts a register 620A and a register 620B. Register 620A might represent a cache register 118 of FIG. 1A, for example. Register 620B might represent a data register 120 of FIG. 1A, for example. The apparatus might be configured to store data to the register 620B for programming to the grouping of memory cells, such as by providing the address of the grouping of memory cells to the row decoder 108 and the column decoder 110 of FIG. 1A. The data latches $652_0$ to $652_R$ of each register 620A and 620B might correspond in a one-to-one relationship to memory cells of a grouping of memory cells. For example, during a programming operation, the data stored in the data latches $652_0$ to $652_R$ of register 620B might represent data to be programmed to memory cells of a logical page of memory cells. Consider the example where a logical page of memory cells includes every other (e.g., even or odd) memory cell having a control gate connected to a given word line 202, M of FIG. 2A equals 63 (i.e., there are 64 bit lines 204) and R of FIGS. 9A-9D equals 31 (i.e., there are 32 data latches 652). During a particular programming operation, data contained in data latches $652_0$ to $652_R$ of register 620B might represent data to be programmed to memory cells selectively connected to bit lines $204_0$, $204_2$, $204_4$, . . . , $204_{M-3}$, and $204_{M-1}$, respectively.

At FIG. 9A, data has been loaded into the data latches 652 of the register 620A. The data latches 652 of the register 620B may be in an initial (e.g., reset) state. At FIG. 9B, data from data latches $652_0$ to $652_R$ of register 620A is loaded (e.g., copied) to the corresponding data latches $652_0$ to $652_R$ of register 620B, respectively. For this first example of storing the address prior to determining that power loss is indicated, the data latches $652_0$ to $652_{y-1}$ (not shown) and $652_{y+8}$ (not shown) to $652_R$ of register 620A might each store respective user data or overhead data, while the data latches $652_y$ to $652_{y+7}$ of register 620A might each store respective address data corresponding to the address (e.g., logical or physical) of the grouping of memory cells to be programmed during the programming operation. As noted previously, the data structure of the page of memory cells may result in some data latches not being used for user data or overhead data.

Figure 9B:
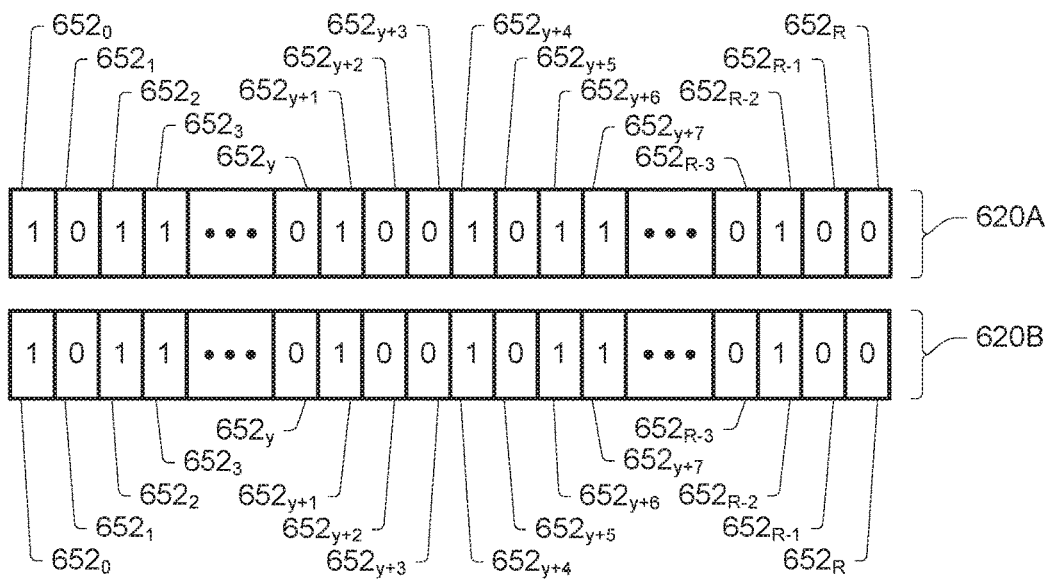
Figure 9C:
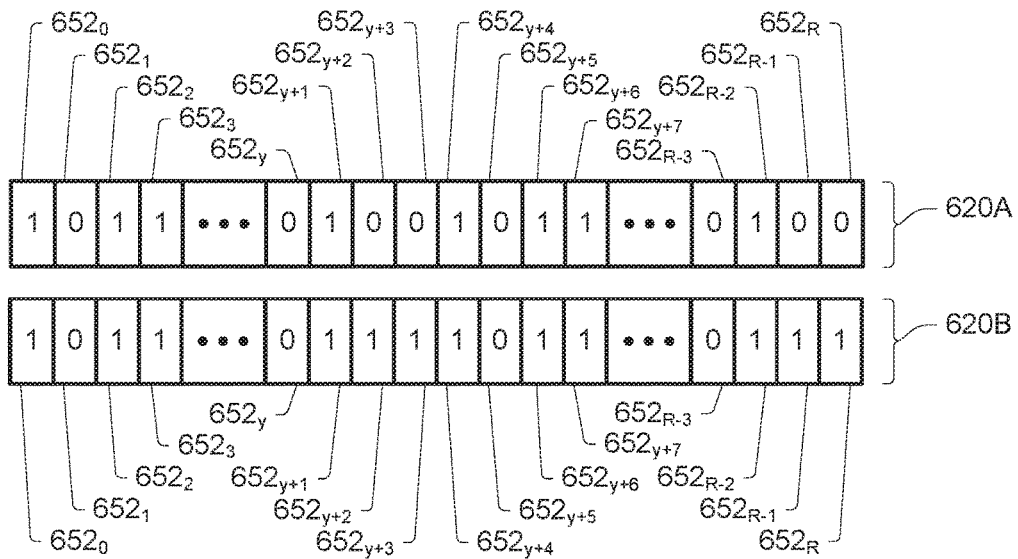
Figure 9D:
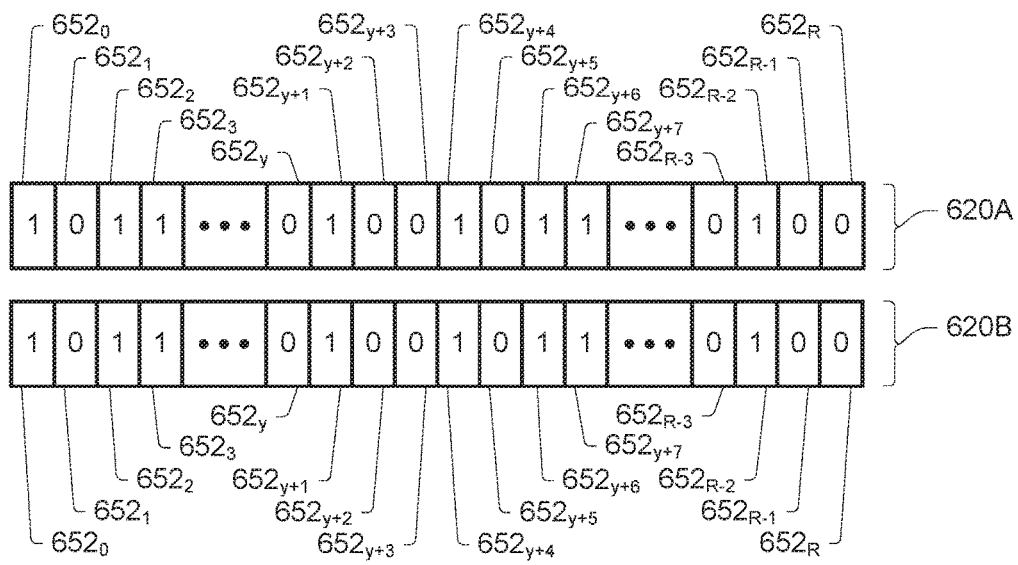

FIG. 9C might represent the state of the registers 620A and 620B during the programming operation after some memory cells have reached their desired data states. For example, FIG. 9C might depict that the memory cells corresponding to data latches $652_{y+2}$, $652_{y+3}$, $652_{R-1}$ and $652_R$ have each reached their respective desired data state, and the data in these data latches has been changed (e.g., toggled) to indicate a desire to inhibit further programming. If power loss is indicated during the programming operation, it may be desirable to restore the original data to the register 620B for programming to the different grouping of memory cells. At FIG. 9D, the data (e.g., original data) in register 620A is again loaded (e.g., copied) to the register 620B for programming to the different grouping of memory cells. At this point, the apparatus might be configured to store data to the register 620B for programming to the different grouping of memory cells, such as by providing the address of the different grouping of memory cells to the row decoder 108 and the column decoder 110 of FIG. 1A.

Figure 10A:
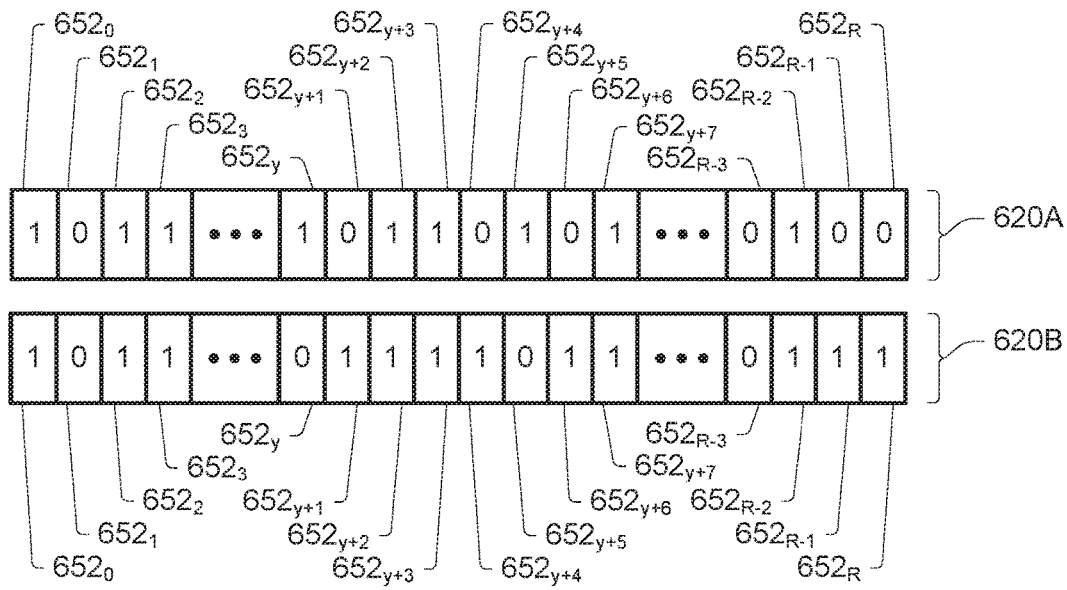
FIGS. 10A-10B are representations of registers in use with further embodiments.
Figure 10B:
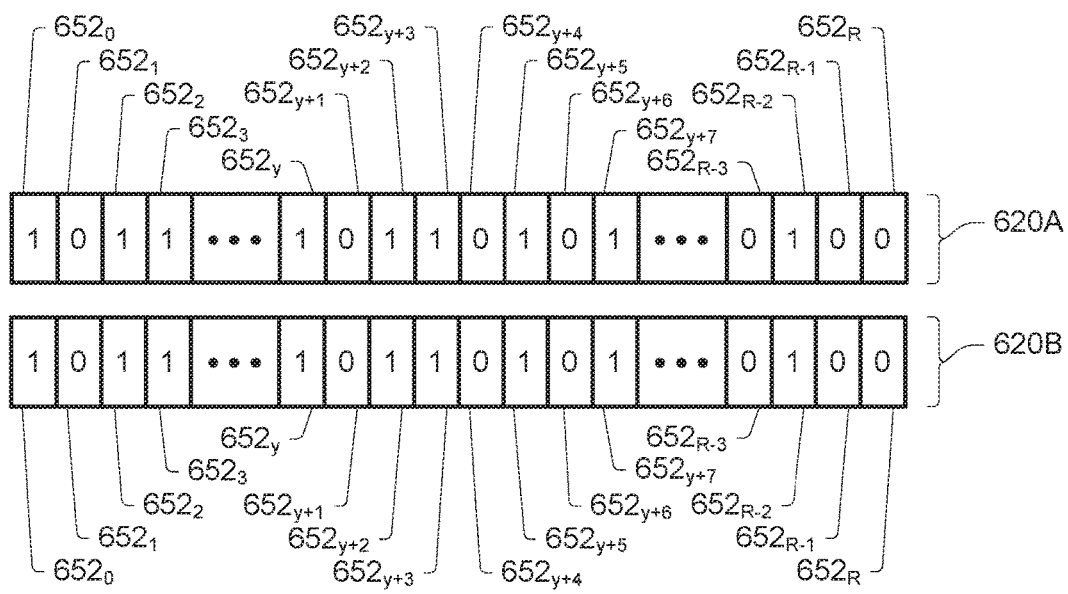

In an alternate example of storing the address subsequent to determining an indication of power loss, the description of FIGS. 9A-9C can be repeated with the change that the data latches $652_0$ to $652_R$ might store respective user data or overhead data (or be unused as defined by the data structure), and might not store any address data corresponding to the grouping of memory cells. If power loss is indicated during the programming operation following the state of the registers 620A and 620B of FIG. 9C, address data corresponding to the address (e.g., logical or physical) of the grouping of memory cells to be programmed during the programming operation might be loaded to a portion of the data latches 652 of the register 620A, e.g., to data latches $652_y$ to $652_{y+7}$, overwriting any original data (e.g., user data or overhead data) contained therein if the data structure defines those data latches for storage of user data or overhead data. FIG. 10A depicts this loading of the address data to the register 620A. For example, the address data corresponding to the grouping of memory cells may be 10110101, and may overwrite the original data 01001011 contained in register 620A in FIG. 9C. For some embodiments, the data latches $652_y$ to $652_{y+7}$ may be unused such that any data contained therein does not correspond to user data or overhead data (e.g., do-not-care data). At FIG. 10B, data from data latches $652_0$ to $652_R$ of register 620A is loaded (e.g., copied) to the corresponding data latches $652_0$ to $652_R$ of register 620B, respectively, for programming to the different grouping of memory cells. At this point, the apparatus might be configured to store data to the register 620B for programming to the different grouping of memory cells, such as by providing the address of the different grouping of memory cells to the row decoder 108 and the column decoder 110 of FIG. 1A.

Figure 11:
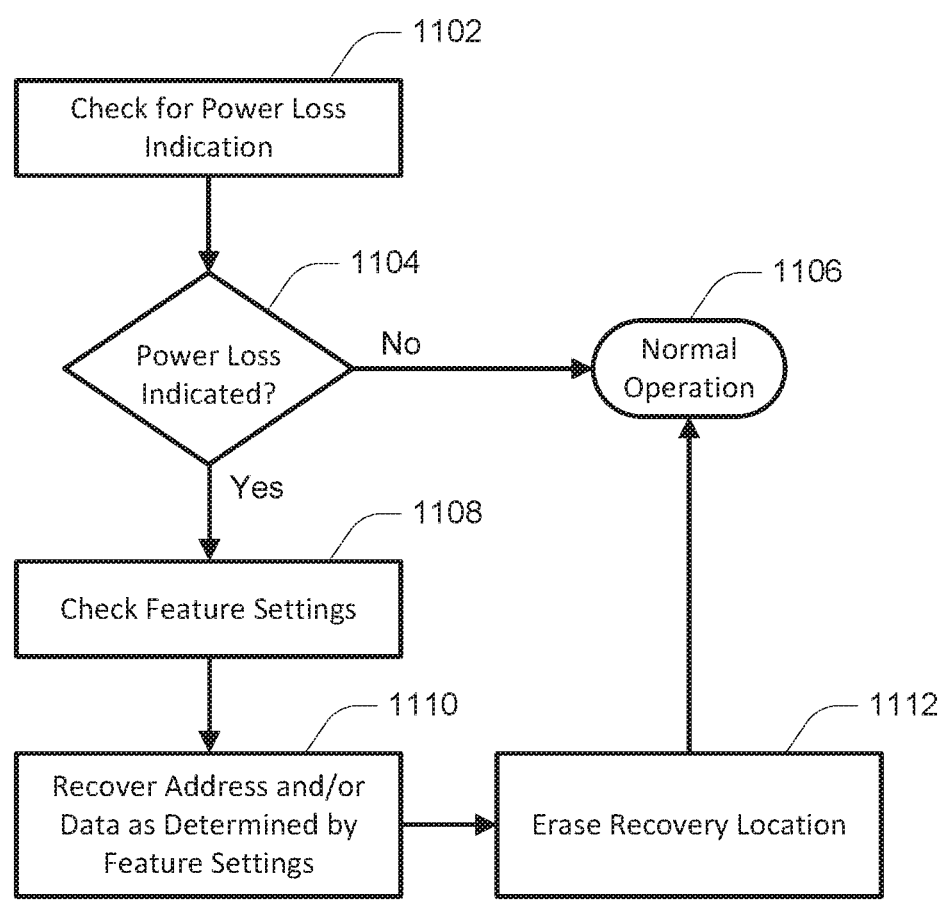
FIG. 11 is a flowchart of a method of operating an apparatus according to an embodiment.

FIG. 11 is a flowchart of a method of operating an apparatus according to an embodiment. FIG. 11 might represent a portion of an initialization process for an apparatus (e.g., a memory) that might be performed at a power-up or reset of the apparatus. At 1102, the apparatus (e.g., a controller of the apparatus) checks for an indication of power loss. For example, a system flag may have one value indicating that no power loss was indicated, and another value indicating that power loss was indicated. As one example, a register of the status register 122 of FIG. 1A might store such a system flag in a manner similar to (e.g., the same as) that described with respect to a register 620. For other embodiments, the apparatus might read the different grouping of memory cells at the predetermined location. The address of the predetermined location might be stored to a register, such as the trim register array 126 of FIG. 1A in a manner similar to (e.g., the same as) that described with respect to a register 620. The memory cells of the different grouping of memory cells at the predetermined location having (e.g., all having) the erased data state might indicate that no power loss was indicated, while a portion (e.g., one or more, including one to all) of the memory cells of the different grouping of memory cells at the predetermined location having a programmed data state (e.g., a data state other than the erased data state) might indicate that power loss was indicated. To deem that power loss was indicated, the portion of memory cells might be some threshold level of memory cells (e.g., a percentage, or some particular number, of the memory cells of the different grouping of memory cells) to mitigate against an erroneous indication.

At 1104, if no power loss is indicated, the apparatus can continue with normal operation at 1106. If power loss is indicated at 1104, feature settings might be checked at 1108 to determine what actions should be taken. Feature settings might include a value indicating whether the address of the grouping of memory cells that were being programmed at the time of the power loss should be recovered, or whether both the address of the grouping of memory cells and the data (e.g., user data and associated overhead data) that was intended for programming to the grouping of memory cells should be recovered. Feature settings might further include the address of the different grouping of memory cells containing the address of the grouping of memory cells (and optionally containing the user data and associated overhead data). For embodiments storing the address and data to two different groupings of memory cells, the feature settings might further include the address of the second different grouping of memory cells containing the user data and overhead data of the grouping of memory cells. At 1110, the address and/or data are recovered as determined by the feature settings. At 1112, the recovery location (e.g., the different grouping(s) of memory cells) is erased, and the apparatus can continue with normal operation at 1106.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating an apparatus, comprising:
receiving user data for programming concurrently to a grouping of memory cells of the apparatus during a single programming operation of the apparatus;
associating an address of the grouping of memory cells with the user data;
determining whether power loss to the apparatus is indicated while programming the user data to the grouping of memory cells; and
if power loss to the apparatus is indicated while programming the user data to the grouping of memory cells, programming the address of the grouping of memory cells to a different grouping of memory cells of the apparatus.

2. The method of claim 1, further comprising programming the user data to the different grouping of memory cells concurrently with programming the address of the grouping of memory cells to the different grouping of memory cells.

3. The method of claim 2, further comprising programming overhead data associated with the user data to the different grouping of memory cells concurrently with programming the user data and the address of the grouping of memory cells to the different grouping of memory cells.

4. The method of claim 1, wherein different grouping of memory cells is a first different grouping of memory cells, and further comprising programming the user data to a second different grouping of memory cells.

5. The method of claim 4, wherein programming the user data to the second different grouping of memory cells occurs at a time selected from a group consisting of prior to programming the address of the grouping of memory cells to the first different grouping of memory cells, concurrently with programming the address of the grouping of memory cells to the first different grouping of memory cells, and subsequent to programming the address of the grouping of memory cells to the first different grouping of memory cells.

6. The method of claim 1, wherein programming the user data to the grouping of memory cells comprises:
inhibiting any memory cell of the grouping of memory cells having its desired data state from programming;
applying a programming pulse to each memory cell of the grouping of memory cells;
verifying whether memory cells of the grouping of memory cells have attained their respective desired data states;
determining whether programming is complete;
if programming is not complete and power loss is not indicated, inhibiting any memory cell of the grouping of memory cells attaining its desired data state from further programming; and
changing a voltage level for programming pulses before applying a next programming pulse to each memory cell of the grouping off memory cells.

7. The method of claim 1, wherein programming the address of the grouping of memory cells to the different grouping of memory cells comprises:
inhibiting any memory cell of the different grouping of memory cells having its desired data state from programming;
applying a programming pulse to each memory cell of the different grouping of memory cells having a voltage level sufficient to provide an expectation of changing the data state of each memory cell of the different grouping of memory cells that is enabled for programming.

8. The method of claim 1, further comprising loading the user data to a register, and wherein associating the address of the grouping of memory cells with the user data comprises loading the address of the grouping of memory cells to the register.

9. The method of claim 8, wherein the apparatus is configured to store data to the register for programming to the grouping of memory cells, wherein loading the user data to the register comprises loading the user data to the register prior to programming the user data to the grouping of memory cells, and wherein loading the address of the grouping of memory cells to the register comprises loading the address of the grouping of memory cells to the register prior to programming the user data to the grouping of memory cells.

10. The method of claim 8, wherein the apparatus is configured to store data to the register for programming to the different grouping of memory cells, wherein loading the user data to the register comprises loading the user data to the register after determining that power loss is indicated, and wherein loading the address of the grouping of memory cells to the register with the user data comprises loading the address of the grouping of memory cells to the register after determining that power loss is indicated.

11. The method of claim 10, wherein loading the address of the grouping of memory cells to the register comprises loading a digit of the address of the grouping of memory cells to a data latch of the register that was configured to store a digit of the user data during the programming operation.

12. A method of operating an apparatus, comprising:
receiving user data for programming concurrently to a grouping of memory cells of the apparatus during a single programming operation of the apparatus, wherein the user data has associated overhead data for programming to the grouping of memory cells of the apparatus;
associating an address of the grouping of memory cells with the user data;
loading digits of the user data to respective data latches of a register;
loading digits of the overhead data to respective data latches of the register;
loading digits of the address of the grouping of memory cells to respective data latches of the register;
programming the digits of the user data, the digits of the overhead data, and the digits of the address of the grouping of memory cells to respective memory cells of the grouping of memory cells;
determining whether power loss to the apparatus is indicated while programming the digits of the user data, the digits of the overhead data, and the digits of the address of the grouping of memory cells to their respective memory cells of the grouping of memory cells; and
if power loss to the apparatus is indicated while programming the digits of the user data, the digits of the overhead data, and the digits of the address of the grouping of memory cells to their respective memory cells of the grouping of memory cells, programming the digits of the address of the grouping of memory cells to respective memory cells of a different grouping of memory cells of the apparatus.

13. The method of claim 12, further comprising:
if power loss to the apparatus is indicated while programming the digits of the user data, the digits of the overhead data, and the digits of the address of the grouping of memory cells to their respective memory cells of the grouping of memory cells, programming the digits of the user data and the digits of the overhead data to respective memory cells of the different grouping of memory cells.

14. The method of claim 12, wherein different grouping of memory cells is a first different grouping of memory cells, and further comprising:
if power loss to the apparatus is indicated while programming the digits of the user data, the digits of the overhead data, and the digits of the address of the grouping of memory cells to their respective memory cells of the grouping of memory cells, programming the digits of the user data and the digits of the overhead data to respective memory cells of a second different grouping of memory cells.

15. A method of operating an apparatus, comprising:
receiving user data for programming concurrently to a grouping of memory cells of the apparatus during a single programming operation of the apparatus, wherein the user data has associated overhead data for programming to the grouping of memory cells of the apparatus;
associating an address of the grouping of memory cells with the user data;
loading digits of the user data to respective data latches of a register;
loading digits of the overhead data to respective data latches of the register;
programming the digits of the user data and the digits of the overhead data to respective memory cells of the grouping of memory cells;
determining whether power loss to the apparatus is indicated while programming the digits of the user data and the digits of the overhead data to their respective memory cells of the grouping of memory cells; and
if power loss to the apparatus is indicated while programming the digits of the user data and the digits of the overhead data to their respective memory cells of the grouping of memory cells:
loading digits of the address of the grouping of memory cells to respective data latches of the register; and
programming the digits of the address of the grouping of memory cells to respective memory cells of a different grouping of memory cells of the apparatus.

16. The method of claim 15, wherein loading the digits of the address of the grouping of memory cells to their respective data latches of the register comprises overwriting a respective data latch of a digit of the user data or a digit of the overhead data.

* * * * *